(12) United States Patent
Hekmatshoar-Tabari et al.

(10) Patent No.: US 8,889,529 B2
(45) Date of Patent: Nov. 18, 2014

(54) HETEROJUNCTION BIPOLAR TRANSISTORS WITH THIN EPITAXIAL CONTACTS

(71) Applicant: International Business Machines Corporation, Armonk, NY (US)

(72) Inventors: Bahman Hekmatshoar-Tabari, Mount Kisco, NY (US); Tak H. Ning, Yorktown Heights, NY (US); Devendra K. Sadana, Pleasantville, NY (US); Ghavam G. Shahidi, Round Ridge, NY (US); Davood Shahrjerdi, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/839,275

(22) Filed: Mar. 15, 2013

(65) Prior Publication Data

US 2013/0313552 A1 Nov. 28, 2013

Related U.S. Application Data

(60) Provisional application No. 61/651,134, filed on May 24, 2012.

(51) Int. Cl.
*H01L 29/66* (2006.01)
*H01L 21/02* (2006.01)
(Continued)

(52) U.S. Cl.
CPC ........ *H01L 29/737* (2013.01); *H01L 21/02639* (2013.01); *H01L 29/735* (2013.01);
(Continued)

(58) Field of Classification Search
CPC ...... H01L 20/04; H01L 20/267; H01L 20/808

USPC .............. 257/62, 65, 197–201; 438/162, 407, 438/482, 527–528

See application file for complete search history.

(56) References Cited

U.S. PATENT DOCUMENTS 4,357,179 A * 11/1982 Adams et al. .................. 438/482
4,814,842 A * 3/1989 Nakagawa et al. ............. 257/65
(Continued)

FOREIGN PATENT DOCUMENTS

| WO | WO 2006040735 A1 | 4/2006 |
|---|---|---|
| WO | WO 2007088494 A1 | 8/2007 |
| WO | WO 2008017714 A1 | 2/2008 |

OTHER PUBLICATIONS

U.S. Appl. No. 13/481,048 Entitled, "Bipolar Junction Transistor With Epitaxial Contacts", filed May 25, 2012, First Name Inventor: Bahman Hekmatshoartabari.

(Continued)

*Primary Examiner* — Matthew W Such
*Assistant Examiner* — Stephen C Smith
(74) *Attorney, Agent, or Firm* — Scully, Scott, Murphy & Presser, P.C.; Louis J. Percello, Esq.

(57) ABSTRACT

Heterojunction bipolar transistors are provided that include at least one contact (e.g., collector, and/or emitter, and/or base) formed by a heterojunction between a crystalline semiconductor material and a doped non-crystalline semiconductor material layer. A highly doped epitaxial semiconductor layer comprising a highly doped hydrogenated crystalline semiconductor material layer portion is present at the heterojunction between the crystalline semiconductor material and the doped non-crystalline semiconductor material layer. Minority carriers within the highly doped epitaxial semiconductor layer have a diffusion length that is larger than a thickness of the highly doped epitaxial semiconductor layer.

21 Claims, 6 Drawing Sheets

(51) Int. Cl.
  *H01L 29/735* (2006.01)
  *H01L 29/16* (2006.01)
  *H01L 29/737* (2006.01)
  *H01L 29/165* (2006.01)

(52) U.S. Cl.
  CPC ... *H01L 21/02529* (2013.01); *H01L 21/02532* (2013.01); *H01L 29/165* (2013.01); *H01L 29/1604* (2013.01); *H01L 21/0262* (2013.01); *H01L 21/02576* (2013.01); *H01L 21/02592* (2013.01); *H01L 21/02447* (2013.01); *H01L 21/02579* (2013.01); *H01L 21/0245* (2013.01); *H01L 29/6625* (2013.01)
  USPC ............ 438/482; 257/62; 257/65; 257/197; 257/198; 257/199; 257/200; 257/201; 438/162; 438/407; 438/527; 438/528

(56) References Cited

U.S. PATENT DOCUMENTS

| | | | |
|---|---|---|---|
| 7,273,799 B2 * | 9/2007 | Todd | 438/478 |
| 2004/0256633 A1 | 12/2004 | Thornton et al. | |
| 2011/0003456 A1 | 1/2011 | Mazzola | |
| 2012/0049282 A1 | 3/2012 | Chen et al. | |
| 2012/0210932 A1 | 8/2012 | Hekmatshoartabari et al. | |
| 2012/0228611 A1 | 9/2012 | Chan et al. | |

OTHER PUBLICATIONS

Sakamoto, Y., et al; "Perfluoropentacene: High-performance p-n junctions and complementary circuits with pentacene", Journal of the American Chemical Society, (Jul. 7, 2004), vol. 126, No. 26, pp. 8138-8140.

Klauk, H. et al., "Flexible organic complementary circuits", Electron Devices, IEEE Transactions on Electron Devices, (Apr. 2005), vol. 52, No. 4, pp. 68-622.

Hekmatshoar, B. et al., "Heterojunction bipolar transistors with hydrogenated amorphous silicon contacts on crystalline silicon", Electronic Letters, (Aug. 30, 2012), vol. 48, No. 18, pp. 1161-1163.

* cited by examiner

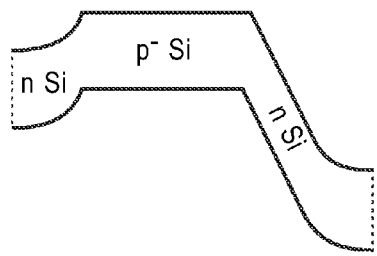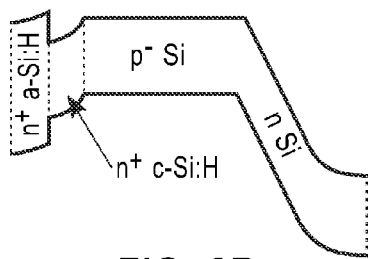
FIG. 8A
Prior Art
FIG. 8B
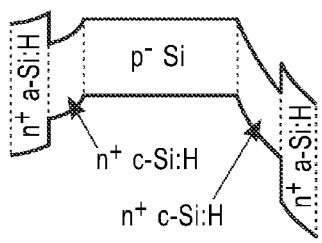
FIG. 8C
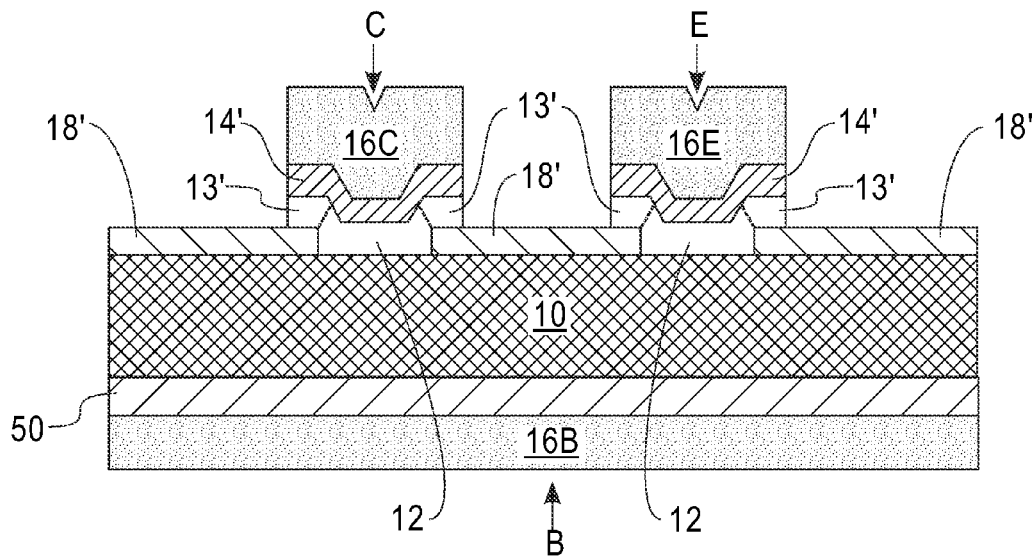
FIG. 9A

HETEROJUNCTION BIPOLAR TRANSISTORS WITH THIN EPITAXIAL CONTACTS

RELATED APPLICATION

The present application claims benefit of U.S. Provisional Application Ser. No. 61/651,134, filed on May 24, 2012, the entire content of which is incorporated herein by reference.

BACKGROUND

The present disclosure relates to semiconductor structures and methods of fabricating the same. More particularly, the present disclosure relates to heterojunction bipolar transistors and methods of fabricating the same.

The heterojunction bipolar transistor (HBT) is a type of bipolar junction transistors (BJT) which uses differing semiconductor materials for the emitter and base regions, thus creating a heterojunction. The HBT improves on the BJT in that the HBT can handle signals of very high frequencies, up to several hundred GHz. HBTs are commonly used in ultrafast circuits, mostly radio-frequency (RF) systems, and in applications requiring high power efficiency, such as RF power amplifiers in cellular phones.

Heterojunction contacts are of interest in bipolar junction transistors particularly at the emitter junction for increasing the gain of the transistor. Conventionally, heterojunctions are formed by epitaxial growth techniques such as metal-organic chemical vapor deposition (MOCVD), which are expensive and/or require high temperatures, typically greater than 600° C. Depending on the application, the high growth temperature may have any or all of the following drawbacks: degradation of minority carrier lifetime, creation of structural defects, undesired impurity diffusion resulting in junction widening, relaxation of strain or generation of undesired strain which may result in buckling or delamination.

SUMMARY

Heterojunction bipolar transistors are provided that include at least one contact (e.g., collector, and/or emitter, and/or base) formed by a heterojunction between a crystalline semiconductor material and a doped non-crystalline semiconductor material layer. A highly doped epitaxial semiconductor layer comprising a highly doped hydrogenated crystalline semiconductor material layer portion is present at the heterojunction between the crystalline semiconductor material and the doped non-crystalline semiconductor material layer. Minority carriers within the highly doped epitaxial semiconductor layer have a diffusion length that is larger than a thickness of the highly doped epitaxial semiconductor layer.

In one aspect of the present disclosure, a heterojunction bipolar transistor is provided. In this aspect of the present disclosure, the heterojunction bipolar transistor includes a crystalline semiconductor material. The heterojunction bipolar transistor of the present disclosure also includes at least one contact that is in direct physical contact with a surface portion of the crystalline semiconductor material. The at least one contact of the present disclosure comprises a doped hydrogenated crystalline semiconductor material layer portion in direct contact with the surface portion of the crystalline semiconductor material, and a doped non-crystalline semiconductor material located on a surface of the doped hydrogenated crystalline semiconductor material layer portion.

In one embodiment, the at least one contact is a collector contact, an emitter contact, or both. In such an embodiment, the crystalline semiconductor material in which the direct contact of the collector contact and/or emitter contact is made is of the first conductivity type, and the doped hydrogenated crystalline semiconductor material layer portion and the doped non-crystalline semiconductor material are each of a second conductivity type which is opposite from the first conductivity type.

In another embodiment, the at least one contact is a base contact. In such an embodiment, the crystalline semiconductor material in which the direct contact of the base contact is made is of a first conductivity type and the doped hydrogenated crystalline semiconductor material layer portion and the doped non-crystalline semiconductor material are also of the first conductivity type. In this case, the concentration of the first conductivity type dopant within at least one of the doped hydrogenated crystalline semiconductor material layer portion and the doped non-crystalline semiconductor material is greater than the concentration of first conductivity dopant within the crystalline semiconductor material in which direct contact of the base contact is made.

In another embodiment of the present disclosure, the at least one contact is a collector contact, an emitter contact, and a base contact. In this embodiment, the crystalline semiconductor material in which the direct contact of the collector contact and the emitter contact is made is of a first conductivity type and the doped hydrogenated crystalline semiconductor material layer portion and the doped non-crystalline semiconductor material of each of the collector contact and emitter contact are both of a second conductivity type which is opposite from the first conductivity type. In the case of the base contact, the crystalline semiconductor material in which the direct contact of the base contact is made is of the first conductivity type and the doped hydrogenated crystalline semiconductor material layer portion and the doped non-crystalline semiconductor material of the base contact are also of the first conductivity type. In this case, the concentration of the first conductivity type dopant within at least one of the doped hydrogenated crystalline semiconductor material layer portion and the doped non-crystalline semiconductor material of the base contact is greater than the concentration of first conductivity dopant within the crystalline semiconductor material in which direct contact of the base contact is made.

In another embodiment, a heterojunction bipolar transistor is provided that includes a crystalline semiconductor material having two crystalline semiconductor regions of a first conductivity type which are spaced apart by an adjoining crystalline semiconductor region of a second conductivity type which is opposite from the first conductivity type. The structure further includes a collector contact in direct physical contact with a surface portion of one of the crystalline semiconductor regions of the first conductivity type, wherein the collector contact comprises a first doped hydrogenated crystalline semiconductor material layer portion in direct contact with the surface portion of one of the crystalline semiconductor regions of the first conductivity type and a first doped non-crystalline semiconductor material of the first conductivity type located on a surface of the first doped hydrogenated crystalline semiconductor material layer portion. The structure also includes an emitter contact in direct physical contact with a surface portion of another of the crystalline semiconductor regions of the first conductivity type, wherein the emitter contact comprises a second doped hydrogenated crystalline semiconductor material layer portion in direct contact with the surface portion of the another of the crystalline semiconductor region of the first conductivity type and a second doped non-crystalline semiconductor material of the first conductivity type located on a surface of the second doped hydrogenated crystalline semiconductor material layer portion. The structure even further includes a base contact in direct physical contact with a surface portion of the adjoining crystalline semiconductor region of the second conductivity type, wherein the base contact comprises a third doped hydrogenated crystalline semiconductor material layer portion in direct contact with the surface portion of the adjoining crystalline semiconductor region of the second conductivity type and a third doped non-crystalline semiconductor material of the second conductivity type located on a surface of the third doped hydrogenated crystalline semiconductor material layer portion.

In accordance with another aspect of the present disclosure, methods of forming a heterojunction bipolar transistor are provided. In one embodiment of the present disclosure, the method of the present disclosure includes forming a blanket layer of passivation material on a surface of a crystalline semiconductor material. Next, at least one opening is provided into the blanket layer of passivation material which exposes at least one portion of the surface of the crystalline semiconductor material. A doped hydrogenated semiconductor material layer is then formed, wherein the doped hydrogenated semiconductor material layer comprises a doped hydrogenated crystalline semiconductor material layer portion formed on the exposed at least one portion of the surface of the crystalline semiconductor material, and doped hydrogenated non-crystalline semiconductor material layer portions formed on a surface of each remaining passivation material layer portion. Next, a doped non-crystalline semiconductor material layer is formed atop the doped hydrogenated semiconductor material layer. At least one electrode material portion is then formed atop the doped non-crystalline semiconductor material layer. An etch is then performed to remove exposed portions of the doped non-crystalline semiconductor material layer and underlying portions of the doped hydrogenated non-crystalline semiconductor material layer portions not protected by the at least one electrode material portion.

In accordance with another embodiment of the present disclosure, the method includes forming a blanket layer of passivation material on a surface of a crystalline semiconductor material. Next, at least one opening is provided into the blanket layer of passivation material which exposes at least one portion of the surface of the crystalline semiconductor material. A doped hydrogenated semiconductor material layer is then formed, wherein the doped hydrogenated semiconductor material layer comprises a doped hydrogenated crystalline semiconductor material layer portion formed on the exposed at least one portion of the surface of the crystalline semiconductor material, and doped hydrogenated non-crystalline semiconductor material layer portions formed on a surface of each remaining passivation material layer portion. Next, a doped non-crystalline semiconductor material layer is formed atop the doped hydrogenated semiconductor material layer. At least one mask is then formed atop the doped non-crystalline semiconductor material layer. An etch is then performed to remove exposed portions of the doped non-crystalline semiconductor material layer and underlying portions of the doped hydrogenated non-crystalline semiconductor material layer portions not protected by the at least one mask. After the etch, the at least one mask is replaced with at least one electrode material portion.

BRIEF DESCRIPTION OF THE DRAWINGS

FIGS. 8A, 8B and 8C are schematic energy band gap diagrams showing the emitter and collector junctions for various bipolar transistors including a conventional homojunction bipolar transistor (not of the present disclosure; and shown in FIG. 8A) and exemplary heterojunction bipolar transistors of the present disclosure (shown in FIGS. 8B, and 8C).

FIGS. 9A-9F are pictorial representations (through cross sectional views) illustrating some additional exemplary heterojunction bipolar transistors of the present disclosure.

DETAILED DESCRIPTION

Figure 1:
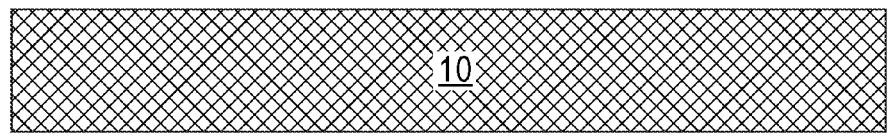
FIG. 1 is a pictorial representation (through a cross sectional view) illustrating a crystalline semiconductor material that can be employed in one embodiment of the present disclosure.

The present disclosure, which relates to heterojunction bipolar transistors and methods of fabricating the same, will now be described in greater detail by referring to the following discussion and drawings that accompany the present application. It is noted that the drawings of the present application are provided for illustrative purposes and, as such, they are not drawn to scale. In the drawings and description that follows, like elements are described and referred to by like reference numerals.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

The present disclosure provides heterojunction bipolar transistors including at least one contact (i.e., emitter contact, and/or base contact, and/or collector contact) formed by a heterojunction between a crystalline semiconductor material and a doped non-crystalline semiconductor material layer. In accordance with the present disclosure, the at least one contact also includes a doped hydrogenated crystalline semiconductor material layer portion present between the crystalline semiconductor material and the doped non-crystalline semiconductor material layer. The term "heterojunction" denotes a p/n, p/n, p+/p, n+/n junction formed between the doped non-crystalline semiconductor material layer and the crystalline semiconductor material.

The term "crystalline" is used throughout the present disclosure to denote a single crystalline material, a multi-crystalline material or a polycrystalline material. Typically, the crystalline semiconductor material that is employed in the present disclosure is comprised of a single crystalline semiconductor material. The term "non-crystalline" is used throughout the present disclosure to denote an amorphous, nano-crystalline or micro-crystalline material. Typically, the non-crystalline semiconductor material that is employed in the present disclosure is amorphous. The term "intrinsic" is used throughout the present disclosure to denote a semiconductor material that contains no doping atoms therein or alternatively a semiconductor material in which the concentration of dopant atoms therein is less than $10^{15}$ atoms/cm$^3$.

Referring first to FIGS. 1-7, there are illustrated basic processing steps that can be used in one embodiment of the present disclosure in forming a heterojunction bipolar transistor of the present disclosure.

FIG. 1 illustrates a crystalline semiconductor material 10 that can be employed in one embodiment of the present disclosure. In some embodiments, and as illustrated, for example, in FIG. 1, the crystalline semiconductor material 10 is a bulk semiconductor substrate. In other embodiments of the present disclosure (not shown in FIG. 1, but illustrated in FIGS. 9E and 9F), the crystalline semiconductor material 10 can be an uppermost semiconductor layer of a semiconductor-on-insulator layer in which at least an insulating layer is located beneath the uppermost semiconductor layer, i.e., the crystalline semiconductor material 10. In some embodiments, a handle substrate (not shown in FIG. 1, but illustrated in FIGS. 9E and 9F) such as, for example, a semiconductor substrate, glass, plastic or metal foil can be located directly beneath the insulating layer. In embodiments where the handle substrate is insulating, a separate insulating layer is not needed since the insulating handle substrate can serve as the insulating material.

In one embodiment, the crystalline semiconductor material 10 that can be employed in the present disclosure can be an III-V compound semiconductor which includes at least one element from Group IIIA (i.e., Group 13) of the Periodic Table of Elements and at least one element from Group VA (i.e., Group 15) of the Periodic Table of Elements. The range of possible formulae for suitable III-V compound semiconductors that can be used in the present disclosure is quite broad because these elements can form binary (two elements, e.g., gallium (III) arsenide (GaAs)), ternary (three elements, e.g., indium gallium arsenide (InGaAs)) and quaternary (four elements, e.g., aluminum gallium indium phosphide (AlInGaP)) alloys.

In another embodiment of the present disclosure, the crystalline semiconductor material 10 can be a semiconductor material having the formula Si$_y$Ge$_{1-y}$ wherein y is 0≤y≤1. In some embodiments, in which y is 1, the crystalline semiconductor material 10 can be comprised entirely of Si. In another embodiment, in which y is 0, the crystalline semiconductor material 10 can be comprised entirely of Ge. In yet another embodiment and when y is other than 0 or 1, the crystalline semiconductor material 10 can be comprised entirely of a SiGe alloy.

In yet another embodiment of the present disclosure, the crystalline semiconductor material 10 can be a semiconductor material comprised of SiC.

In some embodiments of the present disclosure, the crystalline semiconductor material 10 may include nitrogen, oxygen, fluorine, deuterium, chlorine or any combination thereof. When present, the concentration of the aforementioned species can be from 1 atomic % to 10 atomic percent. Other concentrations that are lesser than, or greater than, the aforementioned concentration range can also be present.

In some embodiments, and as shown in FIG. 1, the entirety of the crystalline semiconductor material 10 is of a first conductivity type, i.e., either p-type or n-type. As used herein, "p-type" refers to the addition of impurities to an intrinsic semiconductor that creates deficiencies of valence electrons (i.e., holes). In a Si-containing semiconductor material, examples of p-type dopants, i.e., impurities, include but are not limited to, boron, aluminum, gallium and indium. In one embodiment, in which the first conductivity type of the crystalline semiconductor material 10 of the present disclosure is p-type, the p-type dopant is present in a concentration ranging from $1 \times 10^9$ atoms/cm$^3$ to $1 \times 10^{20}$ atoms/cm$^3$. In another embodiment, in which the first conductivity type of the crystalline semiconductor material 10 of the present disclosure is p-type, the p-type dopant is present in a concentration ranging from $1 \times 10^{14}$ atoms/cm$^3$ to $1 \times 10^{19}$ atoms/cm$^3$. As used herein, "n-type" refers to the addition of impurities that contributes free electrons to an intrinsic semiconductor. In a Si-containing semiconductor, examples of n-type dopants, i.e., impurities, include but are not limited to, antimony, arsenic and phosphorous. In one embodiment, in which the first conductivity type of the crystalline semiconductor material 10 of the present disclosure is n-type, the n-type dopant is present in a concentration ranging from $1 \times 10^9$ atoms/cm$^3$ to $1 \times 10^{20}$ atoms/cm$^3$. In another embodiment, in which the first conductivity type of the crystalline semiconductor material 10 of the present disclosure is n-type, the n-type dopant is present in a concentration ranging from $1 \times 10^{14}$ atoms/cm$^3$ to $1 \times 10^{19}$.

In some embodiments (not shown in FIG. 1, but shown in FIG. 9F), the crystalline semiconductor material 10 contains at least one crystalline semiconductor region of a first conductivity type and an adjoining crystalline semiconductor region of a second conductivity type that is opposite from the first conductivity type. This particular embodiment will be described in greater detail in conjunction with the discussion of FIG. 9F.

The dopant concentration of the first conductivity type and/or, if present, the second conductivity type within the crystalline semiconductor material 10 of the present disclosure may be graded or uniform. By "uniform" it is meant that the dopant concentration of first conductivity type and/or, if present, the second conductivity type is the same throughout the entire thickness of the crystalline semiconductor material 10. For example, a crystalline semiconductor material 10 having a uniform dopant concentration of the first conductivity type and/or, if present, the second conductivity type may have the same dopant concentration at the upper surface and bottom surface of the semiconductor material, as well as the same dopant concentration at a central portion of the semiconductor material between the upper surface and the bottom surface of the crystalline semiconductor material 10. By "graded" it is meant that the dopant concentration of the first conductivity type and/or, if present, the second conductivity type varies throughout the thickness of the crystalline semiconductor material 10. For example, a crystalline semiconductor material 10 having a graded dopant concentration may have an upper surface with a greater dopant concentration of the first conductivity type and/or, if present, the second conductivity type than the bottom surface of the crystalline semiconductor material 10, and vice versa.

In some embodiments, the first or second conductivity type can be introduced during the growth of the crystalline semiconductor material that can be used as element 10 of the present disclosure. Alternatively, the conductivity type can be introduced into an intrinsic crystalline semiconductor material by utilizing ion implantation, and/or gas phase doping and the doped crystalline semiconductor material can be employed as the crystalline semiconductor material 10. When various semiconductor regions of different conductivity type are present within the crystalline semiconductor material 10, a predetermined semiconductor region or regions of the crystalline semiconductor material can be selectively doped to an opposite conductivity type by using ion implantation and/or gas phase doping. The doping of the preselected semiconductor region or regions can occur before or during the processing of the present disclosure.

The thickness of the crystalline semiconductor material 10 can be from 3 nm to 3 μm. Other thicknesses that are lesser than, or greater than, the aforementioned thickness range can also be employed for the thickness of the crystalline semiconductor material 10.

Figure 2:
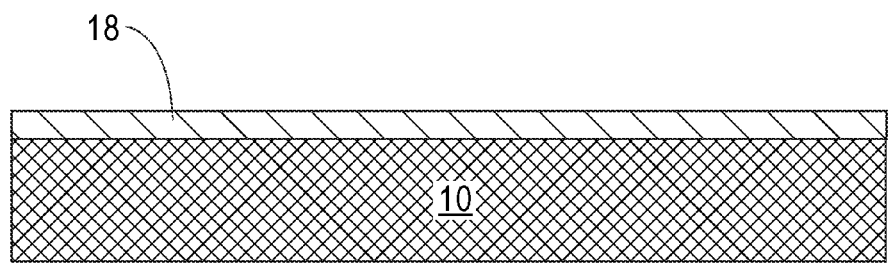
FIG. 2 is a pictorial representation (through a cross sectional view) illustrating the crystalline semiconductor material of FIG. 1 after forming a blanket layer of a passivation material on an exposed surface thereof in accordance with an embodiment of the present disclosure.

Referring now to FIG. 2, there is illustrated the crystalline semiconductor material 10 of FIG. 1 after forming a blanket layer of a passivation material 18 on an exposed surface thereof in accordance with an embodiment of the present disclosure. The passivation material serves to saturate dangling bonds on the surface of the crystalline semiconductor material 10, in order to reduce the recombination of carriers at the surface of the crystalline semiconductor material 10. The passivation material may also reduce the recombination of carriers at the surface of the crystalline semiconductor material 10 by "field-induced" passivation, for example by repelling the minority carriers from the surface of the crystalline semiconductor material 10. Field-induced passivation may be facilitated by the presence of fixed electronic charges in the passivation layer, formation of dipoles at the passivation/substrate interface, or the electric field induced by the workfunction difference between the passivation layer and the substrate semiconductor material. The passivation material may also serve to prevent air or moisture from being introduced into the crystalline semiconductor material 10. The passivation material that can be employed in the present disclosure includes, for example, a hard mask material such as, for example, a semiconductor oxide, a semiconductor nitride, a semiconductor oxynitride, or a multilayered stack thereof. The passivation material may also be comprised of a high-k dielectric (k>silicon oxide) such as aluminum oxide or hafnium oxide. In some embodiments, which is more typical to III-V materials, the passivation material may be comprised of a substantially undoped semiconductor material having a larger band gap than that of the crystalline semiconductor material 10 to passivate the surface of the crystalline semiconductor material 10 by repelling the minority carriers induced by workfunction difference between the semiconductor materials formed by the passivation material and the crystalline semiconductor material 10. In other embodiments, the passivation material can be comprised of silicon oxide, silicon nitride, and/or silicon oxynitride. The blanket layer of passivation material 18 can have a thickness from 5 nm to 50 nm. Other thicknesses that are below or above the aforementioned thickness range can also be employed.

In one embodiment, the blanket layer of passivation material 18 can be formed by a deposition process including, for example, chemical vapor deposition, plasma enhanced chemical vapor deposition, atomic layer deposition or chemical solution. In other embodiments, the blanket layer of passivation material 18 can be formed utilizing a thermal technique such as, for example, oxidation and/or nitridation. In yet other embodiments, a combination of a deposition process and a thermal technique can be used to form the blanket layer of passivation material 18. In still another embodiment, which is more typical to III-V materials, a substantially undoped semiconductor material having a larger band gap than that of the crystalline semiconductor material 10 can be used as the blanket layer of passivation material 18 and such a material can be grown on the crystalline semiconductor material 10 by conventional growth techniques such as, for example, molecular beam epitaxy or metal-organic chemical vapor deposition. The blanket layer of passivation material 18 that is formed at this stage of the present disclosure is a contiguous layer.

Figure 3:
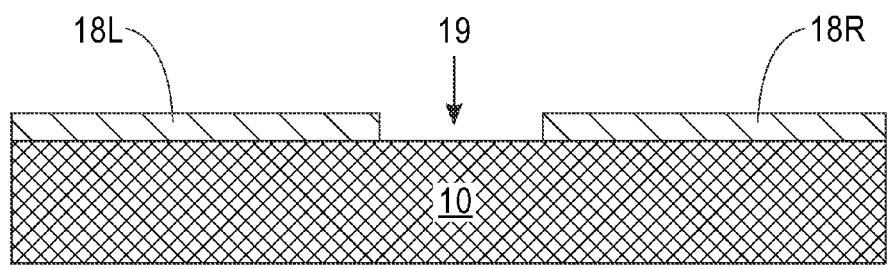
FIG. 3 is a pictorial representation (through a cross sectional view) illustrating the structure of FIG. 2 after forming at least one opening within the blanket layer of a passivation material, wherein each opening exposes a surface portion of the crystalline semiconductor material in accordance with an embodiment of the present disclosure.

Referring now to FIG. 3, there is illustrated the structure of FIG. 2 after forming at least one opening 19 within the blanket layer of a passivation material 18, wherein each opening 19 is a contact opening that exposes a surface portion of the crystalline semiconductor material 10. The remaining portions of the blanket layer of passivation material 18 can now be referred herein as passivation material layer portions 18L, 18R. In some embodiments, the width of each opening 19 that is formed is in the range of 10 nm to 100 nm. In other embodiments, the width of each opening 19 that is formed is in the range of 50 nm to 1 μm. In yet other embodiments, the width of each opening 19 that is formed is in the range of 500 nm to 100 μm. Contact openings narrower than 10 nm or wider than 100 μm can also be employed.

The at least one opening 19 that is formed into the blanket layer of passivation material 18 can be formed by lithography and etching. Lithography includes forming a photoresist material (not shown) on an exposed surface of the blanket layer of passivation material 18, exposing the photoresist material to a desired pattern of radiation and developing the photoresist material utilizing a conventional resist developer. The etching step, which transfers the pattern from the patterned photoresist into the blanket layer of passivation material 18, can include dry etching (i.e., reactive ion etching, ion beam etching, or plasma etching), wet chemical etching, or a combination thereof. Typically, a reactive ion etch is used to transfer the pattern from the patterned photoresist into the blanket layer of passivation material. After pattern transfer, the patterned photoresist is typically removed from the structure utilizing a conventional stripping process such as, for example, ashing.

Figure 4:
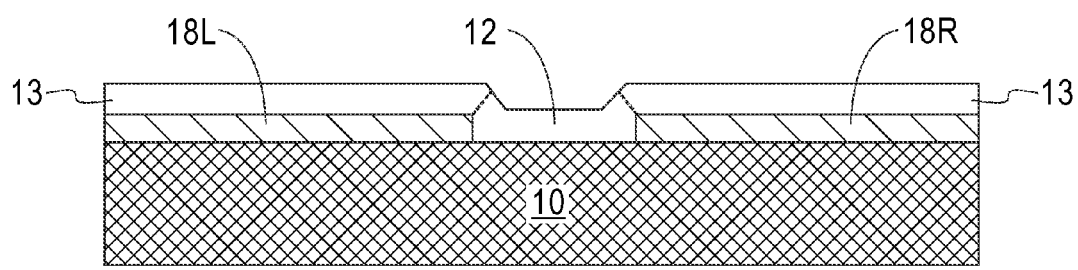
FIG. 4 is a pictorial representation (through a cross sectional view) illustrating the structure of FIG. 3 after forming a doped hydrogenated semiconductor material layer having a doped hydrogenated crystalline semiconductor material layer portion and an adjoining doped hydrogenated non-crystalline semiconductor material layer portion located at each end segment of the doped hydrogenated crystalline semiconductor material layer portion.

Referring now to FIG. 4, there is illustrated the structure of FIG. 3 after forming a doped hydrogenated semiconductor material layer having a doped hydrogenated crystalline semiconductor material layer portion 12 and an adjoining doped hydrogenated non-crystalline semiconductor material layer portion 13 located at each end segment of the doped hydrogenated crystalline semiconductor material layer portion 12. As shown, the doped hydrogenated crystalline semiconductor material layer portion 12 is located on an exposed at least one portion of the surface of the crystalline semiconductor material 10, while the doped non-crystalline semiconductor material layer portions 16 are located on an exposed surface of the passivation material layer portions 18L, 18R. The crystalline portion 12 and the non-crystalline portions 13 of the doped hydrogenated semiconductor material layer are of unitary construction.

The doped hydrogenated semiconductor material layer having a doped hydrogenated crystalline semiconductor material layer portion 12 and an adjoining doped hydrogenated non-crystalline semiconductor material layer portion 13 is formed by epitaxial growth. The term "epitaxial growth and/or deposition" means the growth of a semiconductor material on a deposition surface of a semiconductor material, in which the semiconductor material being grown has the same (or nearly the same) crystalline characteristics as the semiconductor material of the deposition surface. Therefore, in places in which the doped hydrogenated semiconductor material layer is grown on an exposed surface of the crystalline semiconductor material 10, a doped hydrogenated crystalline semiconductor material layer 12 is formed, while in other places in which the doped hydrogenated semiconductor material layer is grown on the passivation material layer portions 18L, 18R, a doped hydrogenated non-crystalline semiconductor material layer portion 13 is formed. It is noted that each non-crystalline portion 13 of the doped hydrogenated semiconductor material layer comprises the same material and nearly the same or the same doping concentration as that of the crystalline portion 12 of the doped hydrogenated semiconductor material layer; however, the hydrogen content and/or distribution, and the doping efficiency (percentage of activated doping species) in the non-crystalline portions 13 and the crystalline portion 12 may be different.

In accordance with an embodiment of the present disclosure, the doped hydrogenated semiconductor material layer (including crystalline portion 12 and non-crystalline portions 13) is epitaxially grown at a temperature of less than 500° C. using a gas mixture that includes a source gas, hydrogen and a dopant gas. The lower temperature limit for the epitaxial growth of the doped hydrogenated semiconductor material layer is generally 100° C. In some embodiments, the doped hydrogenated semiconductor material layer can be epitaxially grown at a temperature from 150° C. to 300° C. In other embodiments, the doped hydrogenated semiconductor material layer can be epitaxially grown at a temperature from 150° C. to 250° C. The temperatures disclosed herein for the epitaxial growth is at the surface of the substrate in which the epitaxial semiconductor material layer is formed.

In one embodiment of the present disclosure, the doped hydrogenated semiconductor material layer (including crystalline portion 12 and non-crystalline portions 13) is epitaxially grown utilizing plasma enhanced chemical vapor deposition (PECVD). PECVD is a deposition process used to deposit films from a gas state (vapor) to a solid state on a deposition substrate. Chemical reactions are involved in the process, which occur after creation of a plasma of the reacting gases. A plasma is any gas in which a significant percentage of the atoms or molecules are ionized. Fractional ionization in plasmas used for deposition and related materials processing varies from about $10^{-4}$ in capacitive discharge plasmas to as high as 5-10% in high density inductive plasmas. Processing plasmas are typically operated at pressures of a few millitorr to a few torr, although arc discharges and inductive plasmas can be ignited at atmospheric pressure. In some embodiments, the plasma is created by RF (AC) frequency, such as a radio frequency induced glow charge, or DC discharge between two electrodes, the space between which is filled with the reacting gases. In one example, a PECVD device employs a parallel plate chamber configuration. In other embodiments, a hot-wire chemical vapor deposition process can be used in forming the doped hydrogenated semiconductor material layer.

In one embodiment, the source gas used to form the doped hydrogenated semiconductor material layer (including crystalline portion 12 and non-crystalline portions 13) may comprise a Si-containing precursor, such as, for example, a silane and a disilane and/or a germanium-containing precursor such as, for example, a germane, $GeH_4$. In some embodiments, Si-containing and Ge-containing precursors can be used in forming the doped hydrogenated semiconductor material layer. Other gases including a carbon source such, as for example, $CH_4$ may be used.

In one embodiment and to provide epitaxial growth of a doped hydrogenated semiconductor material layer (including crystalline portion 12 and non-crystalline portions 13), a gas mixture including a ratio of hydrogen to source gas of from greater than 5:1 can be used. In another embodiment, the ratio of hydrogen to source gas that can be used ranges from 5:1 to 1000:1. For example, epitaxial growth of silicon is possible at temperatures as low as 150° C. with ratios of hydrogen to silane ($SiH_4$) ranging from 5:1 to 20:1.

The dopant gas that can be present in the epitaxial growth process provides the conductivity type, either n-type or p-type, to the doped hydrogenated semiconductor material layer (including crystalline portion 12 and non-crystalline portions 13).

In some embodiments and when an emitter contact and/or a base contact are to be formed, the conductivity type of the doped hydrogenated semiconductor material layer is different from that of the crystalline semiconductor material 10. In some embodiments and when a base contact is to be formed, the conductivity type of the doped hydrogenated semiconductor material layer is the same as that of the crystalline semiconductor material 10. In such an embodiment, however the dopant concentration within the doped hydrogenated semiconductor material layer may be greater than the dopant concentration within the crystalline semiconductor material 10.

When a doped hydrogenated semiconductor material layer (including crystalline portion 12 and non-crystalline portions 13) of an n-type conductivity is to be formed, the dopant gas includes at least one n-type dopant, e.g., phosphorus or arsenic. For example, when phosphorus is the n-type dopant, the dopant gas can be phosphine ($PH_3$), and when arsenic is the n-type dopant, the dopant gas can be arsine ($AsH_3$). In one example, when the conductivity type dopant is n-type, the dopant gas include phosphine gas ($PH_3$) present in a ratio to silane ($SiH_4$) ranging from 0.01% to 10%. In another example, when the conductivity type dopant is n-type, the dopant gas include phosphine gas ($PH_3$) present in a ratio to silane ($SiH_4$) ranging from 0.1% to 2%.

When a doped hydrogenated semiconductor material layer (including crystalline portion 12 and non-crystalline portions 13) of a p-type conductivity is to be formed, a dopant gas including at least one p-type dopant, e.g., B, is employed. For example, when boron is the p-type dopant, the dopant gas can be diborane ($B_2H_6$). In one embodiment, wherein the conductivity type dopant is p-type, the dopant gas may be diborane ($B_2H_6$) present in a ratio to silane ($SiH_4$) ranging from 0.01% to 10%. In another embodiment, wherein the conductivity type dopant is p-type, the dopant gas may be diborane ($B_2H_6$) present in a ratio to silane ($SiH_4$) ranging from 0.1% to 2%. In yet another embodiment, in which the conductivity type dopant is p-type, the dopant gas for may be trimethylboron (TMB) present in a ratio to silane ($SiH_4$) ranging from 0.1% to 10%.

In one embodiment of the present disclosure, the pressure for the PECVD process that can be used for epitaxially growing the doped hydrogenated semiconductor material layer (including crystalline portion 12 and non-crystalline portions 13) can range from 10 mTorr to 5 Torr, and in one example may be in the range of 250 mtorr to 900 mTorr. The power density for the PECVD process for epitaxially growing the doped hydrogenated semiconductor material layer may range from 1 mW/cm$^2$ to 100 mW/cm$^2$, and in one example may be in the range of 3 mW/cm$^2$ to 10 mW/cm$^2$. Further details regarding the epitaxial growth process for forming the doped hydrogenated semiconductor material layer of the present disclosure are described in U.S. Patent Publication No. 2012/0210932, which is owned by the assignee of the present disclosure, and is incorporated herein by reference.

In some embodiments, ammonia (NH$_3$), nitrous oxide (N$_2$O) or other gas sources may be used for nitrogen containing layers. Carbon dioxide (CO$_2$), N$_2$O or O$_2$ may be used to provide oxygen for oxygen containing layers. A carrier gas such as hydrogen (H$_2$), deuterium (D$_2$) helium (He) or argon (Ar) may be used for any or all of the layers. The carrier gas may be pre-mixed with the gas sources or flowed simultaneously with the gas source at the time of growth.

The doped hydrogenated semiconductor material layer (including crystalline portion 12 and non-crystalline portions 13) may comprise a same or different semiconductor material as that of the crystalline semiconductor material 10. In one embodiment, the doped hydrogenated semiconductor material layer (including crystalline portion 12 and non-crystalline portions 13) has a formula Si$_x$Ge$_{1-x}$ wherein x is $0 \leq x \leq 1$. As such, the doped hydrogenated semiconductor material layer (including crystalline portion 12 and non-crystalline portions 13) may comprise Si (when x is 1), Ge (when x is 0), or a SiGe (when x is other than 1, or 0).

In accordance with the present disclosure, the doped hydrogenated semiconductor material layer (including crystalline portion 12 and non-crystalline portions 13) contains from 5 atomic % to 40 atomic % hydrogen therein. In one embodiment, the doped hydrogenated semiconductor material layer (including crystalline portion 12 and non-crystalline portions 13) contains from 10 atomic % to 25 atomic % hydrogen therein. In yet another embodiment, the doped hydrogenated semiconductor material layer (including crystalline portion 12 and non-crystalline portions 13) contains from 20 atomic % to 30 atomic % hydrogen therein.

In some embodiments of the present disclosure, the doped hydrogenated semiconductor material layer (including crystalline portion 12 and non-crystalline portions 13) can contain C therein. When present, C can be present in a concentration from 0 atomic % to 50 atomic %. In some embodiments, the doped hydrogenated semiconductor material layer (including crystalline portion 12 and non-crystalline portions 13) can contain from 0 atomic % to 25 atomic % carbon therein. The carbon impurity can be added by way of either a source gas that includes carbon, or by introducing a carbon source gas into the gas mixture that is employed in the present disclosure for forming the doped hydrogenated semiconductor material layer.

In some embodiments of the present disclosure, the doped hydrogenated semiconductor material layer (including crystalline portion 12 and non-crystalline portions 13) may include nitrogen, oxygen, fluorine, deuterium, chlorine or any combination thereof. When present, the concentration of the aforementioned species can be from 1 atomic % to 10 atomic percent. Other concentrations that are lesser than, or greater than, the aforementioned concentration range can also be present.

As mentioned above, the dopant that is contained within the doped hydrogenated semiconductor material layer (including crystalline portion 12 and non-crystalline portions 13) can be a p-type dopant or an n-type dopant. In a Si-containing doped hydrogenated semiconductor material layer examples of p-type dopants, i.e., impurities, include but are not limited to, boron, aluminum, gallium and indium. In one embodiment, in which the doped hydrogenated semiconductor material layer includes a p-type dopant, the p-type dopant is present in a concentration ranging from $10^{16}$ atoms/cm$^3$ to $10^{21}$ atoms/cm$^3$. In another embodiment, in which the doped hydrogenated semiconductor material layer contains p-type dopant, the p-type dopant is present in a concentration ranging from $10^{18}$ atoms/cm$^3$ to $5 \times 10^{20}$ atoms/cm$^3$. In a Si-containing doped hydrogenated semiconductor material layer, examples of n-type dopants, i.e., impurities, include but are not limited to, antimony, arsenic and phosphorous. In one embodiment, in which the doped hydrogenated semiconductor material layer contains an n-type dopant, the n-type dopant is present in a concentration ranging from $10^{16}$ atoms/cm$^3$ to $10^{21}$ atoms/cm$^3$. In another embodiment, in which the doped hydrogenated semiconductor material layer contains an n-type dopant, the n-type dopant is present in a concentration ranging from $10^{18}$ atoms/cm$^3$ to $5 \times 10^{20}$ atoms/cm$^3$.

The thickness of the doped hydrogenated semiconductor material layer (including crystalline portion 12 and non-crystalline portions 13) may range from 2 nm to 100 nm. In another embodiment, the thickness of the doped hydrogenated semiconductor material layer ranges from 5 nm to 15 nm. The doped hydrogenated crystalline semiconductor material layer portion 12 of the doped hydrogenated semiconductor material layer has the same (or nearly the same) crystalline characteristics as the crystalline semiconductor material layer portion 12. Thus, the doped hydrogenated crystalline semiconductor material layer portion 12 of the doped hydrogenated semiconductor layer has an epitaxial relationship with the crystalline semiconductor material 10.

The doped hydrogenated semiconductor material layer (including the crystalline semiconductor material layer portion 12 and the non-crystalline semiconductor material layer portions 13) may be a single layer. In another embodiment, the doped hydrogenated semiconductor material layer (including the crystalline semiconductor material layer portion 12 and the non-crystalline semiconductor material layer portions 13) may be a multilayered structure containing a same semiconductor material or different semiconductor materials. When different semiconductor materials are used, it is possible to provide a multilayered stack of doped hydrogenated semiconductor material layers that have alternating wide and narrow band gaps. Also, the doped hydrogenated semiconductor material can have a wider or narrower band gap as compared to the crystalline semiconductor material 10. Also, the composition of the doped hydrogenated semiconductor material layer(s) may be constant or vary across the layer(s).

Figure 5:
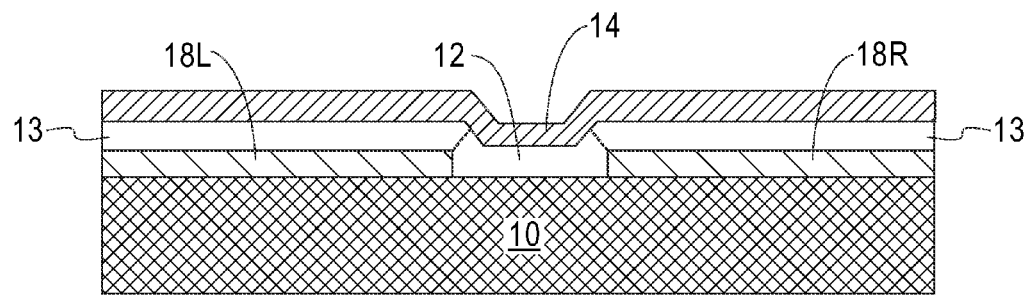
FIG. 5 is a pictorial representation (through a cross sectional view) illustrating the structure of FIG. 4 after forming a doped non-crystalline semiconductor material layer on an exposed surface of the doped hydrogenated semiconductor material layer.

Referring now to FIG. 5, there is illustrated the structure of FIG. 4 after forming a doped non-crystalline semiconductor material layer 14 on an exposed surface of the doped hydrogenated semiconductor material layer (including crystalline portion 12 and non-crystalline portions 13).

In one embodiment of the present disclosure, the doped non-crystalline semiconductor material layer 14 may be hydrogenated. In one embodiment in which the doped non-crystalline semiconductor material layer 14 is a doped hydrogenated non-crystalline semiconductor material, the doped hydrogenated non-crystalline semiconductor material may contain from 5 atomic % to 40 atomic % hydrogen therein. In another embodiment in which the doped non-crystalline semiconductor material layer 14 is a doped hydrogenated non-crystalline semiconductor material, the doped hydrogenated non-crystalline semiconductor material may contain from 10 atomic % to 25 atomic % hydrogen therein. In yet another embodiment in which the doped non-crystalline semiconductor material layer 14 is a doped hydrogenated non-crystalline semiconductor material, the doped hydrogenated non-crystalline semiconductor material may contain from 20 atomic % to 30 atomic % hydrogen therein.

The doped non-crystalline semiconductor material layer 14 may comprise a same or different semiconductor material as that of the crystalline semiconductor material 10. Also, the doped non-crystalline semiconductor material layer 14 may comprise a same or different semiconductor as the doped hydrogenated semiconductor material layer. In one embodiment, the doped non-crystalline semiconductor material layer 14 has a formula $Si_qGe_{1-q}$ wherein q is 0≤q≤1. As such, the doped non-crystalline semiconductor material layer 14 may comprise Si (when q is 1), Ge (when q is 0), or a SiGe (when q is other than 1, or 0).

In some embodiments of the present disclosure, the doped non-crystalline semiconductor material layer 14 can contain C therein. When present, C can be present in a concentration from 0 atomic % to 50 atomic %. In some embodiments, the doped non-crystalline semiconductor material layer 14 can contain from 0 atomic % to 25 atomic % carbon therein. The carbon impurity can be added by way of either a source gas that includes carbon, or by introducing a carbon source gas into the gas mixture that is employed in the present disclosure for forming the doped non-crystalline semiconductor material layer 14.

In some embodiments of the present disclosure, the doped non-crystalline semiconductor material layer 14 may include nitrogen, oxygen, fluorine, deuterium, chlorine or any combination thereof. When present, the concentration of the aforementioned species can be from 1 atomic % to 10 atomic percent. Other concentrations that are lesser than, or greater than, the aforementioned concentration range can also be present.

The dopant that is contained within the doped non-crystalline semiconductor material layer 14 can be a p-type dopant or an n-type dopant. In some embodiments, the heterojunction bipolar transistor includes a collector contact and/or an emitter contact in which each doped non-crystalline semiconductor material layer 14 of such contacts has a conductivity type that is opposite to the conductivity type of the crystalline semiconductor material 10. In such a structure and in the case of a base contact, the doped non-crystalline semiconductor material layer 14 of such a contact has a conductivity type that is the same as the conductivity type of the crystalline semiconductor material 10. In the case of the base contact, however, the concentration of the dopant within at least one of the doped hydrogenated crystalline semiconductor material layer and the doped non-crystalline semiconductor material layer 14 of the base contact is greater than the concentration, of the same dopant type, in the crystalline semiconductor material 10. In one embodiment, the concentration of the dopant within the doped hydrogenated crystalline semiconductor material layer of the base contact is greater than the concentration, of the same dopant type, in the crystalline semiconductor material 10. In another embodiment, the concentration of the dopant within the doped non-crystalline semiconductor material layer of the base contact is greater than the concentration, of the same dopant type, in the crystalline semiconductor material 10. In yet another embodiment, the concentration of the dopant within the doped hydrogenated crystalline semiconductor material layer and the doped non-hydrogenated semiconductor layer of the base contact is greater than the concentration, of the same dopant type, in the crystalline semiconductor material 10. The dopant within the doped non-crystalline semiconductor material layer 14 can be uniformly present or present as a gradient. Within the respective contact region, the doped hydrogenated semiconductor material layer has a same conductivity type as the overlying doped non-crystalline semiconductor material layer 14.

In some embodiments (see, for example, FIG. 9F), the heterojunction bipolar transistor includes a collector contact and/or an emitter contact in which each doped non-crystalline semiconductor material layer 14 of such contacts has a conductivity type that is the same type as one of the crystalline semiconductor regions within the crystalline semiconductor material 10. In such a structure and in the case of the collector and/or emitter contact, the concentration of the dopant within the doped non-crystalline semiconductor material layer 14 of the collector and/or emitter may be greater than the concentration, of the same dopant type, in the crystalline semiconductor material 10. In such a structure and in the case of a base contact, the doped non-crystalline semiconductor material layer 14 of such a contact has a conductivity type that is the same as the conductivity type of another crystalline semiconductor region of the crystalline semiconductor material 10. In the case of the base contact, however, the concentration of the dopant within at least one of the doped hydrogenated crystalline semiconductor material layer and the doped non-crystalline semiconductor material layer 14 of the base contact is greater than the concentration, of the same dopant type, in the crystalline semiconductor material 10. In one embodiment, the concentration of the dopant within the doped hydrogenated crystalline semiconductor material layer of the base contact is greater than the concentration, of the same dopant type, in the crystalline semiconductor material 10. In another embodiment, the concentration of the dopant within the doped non-crystalline semiconductor material layer of the base contact is greater than the concentration, of the same dopant type, in the crystalline semiconductor material 10. In yet another embodiment, the concentration of the dopant within the doped hydrogenated crystalline semiconductor material layer and the doped non-hydrogenated semiconductor layer of the base contact is greater than the concentration, of the same dopant type, in the crystalline semiconductor material 10. Within the respective contact region, the doped hydrogenated semiconductor material layer has a same conductivity type as the overlying doped non-crystalline semiconductor material layer 14.

In a Si-containing doped non-crystalline semiconductor material layer 14 examples of p-type dopants, i.e., impurities, include but are not limited to, boron, aluminum, gallium and indium. In one embodiment, in which the doped non-crystalline semiconductor material layer 14 includes a p-type dopant, the p-type dopant is present in a concentration ranging from $10^{16}$ atoms/cm³ to $10^{21}$ atoms/cm³. In another embodiment, in which the doped non-crystalline semiconductor material layer 14 contains p-type dopant, the p-type dopant is present in a concentration ranging from $10^{18}$ atoms/cm³ to $5\times10^{20}$ atoms/cm³. In a Si-containing doped non-crystalline semiconductor material layer 14, examples of n-type dopants, i.e., impurities, include but are not limited to, antimony, arsenic and phosphorous. In one embodiment, in which the doped non-crystalline semiconductor material layer 14 contains an n-type dopant, the n-type dopant is present in a concentration ranging from $10^{16}$ atoms/cm³ to $10^{21}$ atoms/cm³. In another embodiment, in which doped non-crystalline semiconductor material layer 14 contains an n-type dopant, the n-type dopant is present in a concentration ranging from $10^{18}$ atoms/cm$^3$ to $5 \times 10^{20}$ atoms/cm$^3$.

In one embodiment, the doped non-crystalline semiconductor material layer 14 can be formed by plasma enhanced chemical vapor deposition (PECVD). In other embodiments, a hot-wire chemical vapor deposition (HWCVD) process can be used in forming the doped non-crystalline semiconductor material layer 14. In yet another embodiment, sputtering can be used in forming the doped non-crystalline semiconductor material layer 14. The doped non-crystalline semiconductor material layer 14 can be formed at a temperature close to 200° C., with highest quality films typically grown at temperatures in the range of 150° C.-250° C., however temperatures in the range from room-temperature (i.e., 20° C.) up to 450° C. may be used.

The doped non-crystalline semiconductor material 14 can be formed utilizing source gases, and other gases that are the same as that mentioned above for the doped hydrogenated semiconductor material layer. The dopant within the doped non-crystalline semiconductor material layer 14 can be introduced during the formation of the non-crystalline semiconductor material utilizing one or more dopant gases. Alternatively, an intrinsic non-crystalline semiconductor material layer can be formed and then doped utilizing ion implantation and/or gas phase doping forming the doped non-crystalline semiconductor material layer 14.

In some embodiments of the present disclosure, the doped hydrogenated semiconductor layer (including the crystalline portion 12 and the non-crystalline portions 13) and the doped non-crystalline semiconductor material layer 14 can be formed within the same deposition tool without breaking vacuum between depositions. In other embodiments, the doped hydrogenated semiconductor layer (including the crystalline portion 12 and the non-crystalline portions 13) and the doped non-crystalline semiconductor material layer 14 can be formed in different processing tools and, as such, a vacuum is not maintained between the two deposition steps.

When a dopant gas is employed in forming the doped non-crystalline semiconductor material layer 14, the dopant gas that can be present during the deposition process provides the conductivity type, either n-type or p-type, to the doped non-crystalline semiconductor material layer 14. When a doped non-crystalline semiconductor material layer 14 of an n-type conductivity is to be formed, the dopant gas includes at least one n-type dopant, e.g., phosphorus or arsenic. For example, when phosphorus is the n-type dopant, the dopant gas can be phosphine ($PH_3$), and when arsenic is the n-type dopant, the dopant gas can be arsine ($AsH_3$). In one example, when the conductivity type dopant is n-type, the dopant gas include phosphine gas ($PH_3$) present in a ratio to silane ($SiH_4$) ranging from 0.01% to 10%. In another example, when the conductivity type dopant is n-type, the dopant gas include phosphine gas ($PH_3$) present in a ratio to silane ($SiH_4$) ranging from 0.1% to 2%.

When a doped non-crystalline semiconductor material layer 14 of a p-type conductivity is to be formed, a dopant gas including at least one p-type dopant, e.g., B, is employed. For example, when boron is the p-type dopant, the dopant gas can be diborane ($B_2H_6$). In one embodiment, wherein the conductivity type dopant is p-type, the dopant gas may be diborane ($B_2H_6$) present in a ratio to silane ($SiH_4$) ranging from 0.01% to 10%. In another embodiment, wherein the conductivity type dopant is p-type, the dopant gas may be diborane ($B_2H_6$) present in a ratio to silane ($SiH_4$) ranging from 0.1% to 2%. In yet another embodiment, in which the conductivity type dopant is p-type, the dopant gas for may be trimethylboron (TMB) present in a ratio to silane ($SiH_4$) ranging from 0.1% to 10%.

The thickness of the doped non-crystalline semiconductor material layer 14 is typically from 5 nm to 25 nm, although thinner or thicker layers may be used as well. Since the doping efficiency of non-crystalline semiconductors is typically low, the doped non-crystalline semiconductor layer 14 is sufficiently thin to ensure low contact resistance at the junction. The thickness of the doped hydrogenated crystalline semiconductor material layer portion 12 is chosen to be shorter and preferably much shorter than the diffusion length of minority carriers in the doped hydrogenated semiconductor material layer 14. The minority carrier diffusion length depends on the doping concentration (decreasing as doping increases) as known in the art.

In some embodiments (not shown), at least one other doped non-crystalline semiconductor material layer can be formed atop the doped non-crystalline semiconductor material layer 14. In this embodiment, the other doped non-crystalline semiconductor material layer, which can be non-hydrogenated or hydrogenated, is of the same conductivity type as the doped non-crystalline semiconductor material layer 14 and is comprised of a lower band gap semiconductor material as that of the doped non-crystalline semiconductor material layer 14. In such an embodiment, the at least one other doped non-crystalline semiconductor material layer includes a different semiconductor material as that described above for the doped non-crystalline semiconductor material layer 14. For example, and when the doped non-crystalline semiconductor material layer 14 comprises silicon, the at least one other doped non-crystalline semiconductor material layer can comprise germanium. The dopant concentration and, if present, hydrogen concentration, in the at least one other doped non-crystalline semiconductor material layer are within the ranges mentioned above for the doped non-crystalline semiconductor material layer 14. The dopant within the at least one other doped non-crystalline semiconductor material layer can be uniformly present or present as a gradient. The at least one other doped non-crystalline semiconductor material layer can be formed utilizing one of the deposition techniques mentioned above in forming the doped non-crystalline semiconductor material layer 14.

In some embodiments (not shown), the doped non-crystalline semiconductor material layer 14 is a multilayered stack comprising alternating layers of wide band gap and narrow band gap semiconductor materials. The terms "wide" and "narrow" are relative to each other. For example, the doped non-crystalline semiconductor material layer 14 may comprise a first doped non-crystalline semiconductor material having a wide band gap such as Si, a second doped non-crystalline semiconductor material having a narrow band gap such as, for example, Ge and a third doped non-crystalline semiconductor material having a wide band gap such as, for example, Si. A multilayered doped non-crystalline semiconductor material layer stack can be formed utilizing one of the deposition techniques mentioned above in forming the doped non-crystalline semiconductor material layer 14.

In some embodiments, the doped non-crystalline semiconductor material layer 14 which is in direct contact with the crystalline portion 12 has a band gap larger than that of the crystalline semiconductor material 10. In such embodiments, if the stack of crystalline semiconductor material portion 12 and the doped non-crystalline semiconductor material layer 14 is used for an emitter contact, the injection of carriers from base into the emitter is suppressed due the larger band gap of the doped non-crystalline semiconductor material layer 14, and therefore the gain of the heterojunction bipolar transistor is enhanced.

Figure 6:
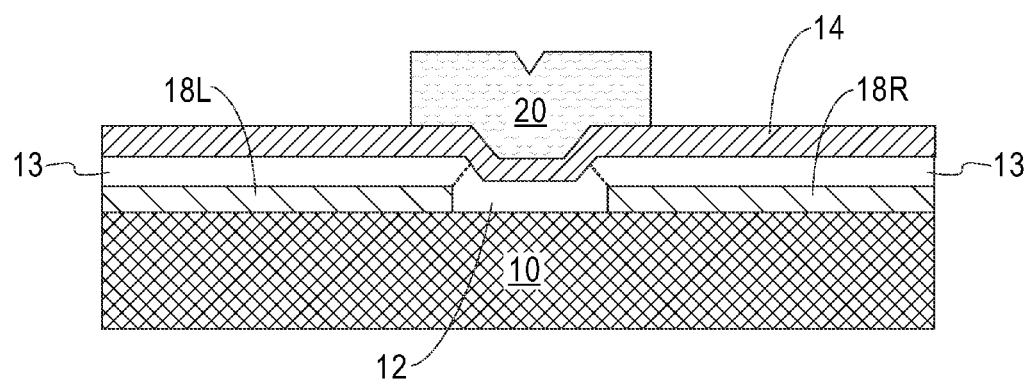
FIG. 6 is a pictorial representation (through a cross sectional view) illustrating the structure of FIG. 5 after forming at least one mask atop the doped non-crystalline semiconductor material layer and above each of the at least one openings.

Referring now to FIG. 6, there is illustrated the structure of FIG. 5 after forming at least one mask 20 atop the doped non-crystalline semiconductor material layer 14 and above each of the at least one openings. As shown, the at least one mask 20 is located above the doped hydrogenated crystalline semiconductor material layer portion 12 of the doped hydrogenated layer and end segments, of the doped hydrogenated non-crystalline semiconductor material layer portion 17.

In one embodiment, the at least one mask 20 that can be used may include a hard mask material that is the same or different from that of the passivation material. In another embodiment, the at least one mask 20 may be composed of a conductive material which can also be used for the electrode material portion of the structures of the present disclosure. The usage of a conductive material as mask 20 is advantageous since the same material can be used as the electrode of the heterojunction bipolar transistor of the present disclosure. Examples of conductive materials which can serve as a mask and as an electrode material portion include, a doped Si-containing material, a conductive metal, a conductive metal alloy comprising at least two conductive metals, a conductive metal nitride, a transparent conductive oxide and/or a conductive metal silicide. Examples of conductive metals that can be used include, for example, Cu, W, Pt, Al, Pd, Ru, Ni, and Ir.

In one embodiment and when the mask is other than a conductive material, the at least one mask 20 can be formed by providing a blanket layer of mask material utilizing one of the techniques mentioned above for either forming the blanket layer of passivation material 18. In another embodiment and when the mask is a conductive material, the conductive material can be formed using a deposition process including, for example, chemical vapor deposition, plasma enhanced chemical vapor deposition, sputtering, chemical solution deposition, or plating. Metal silicides can be formed utilizing any conventional silicidation process that is well known to those skilled in the art.

After forming the blanket layer of mask material, the blanket layer of mask material is patterned by lithography and etching to provide the structure shown in FIG. 6. The etch is selective in removing exposed portions of the mask material not protected by remaining portions of the photoresist.

Figure 7:
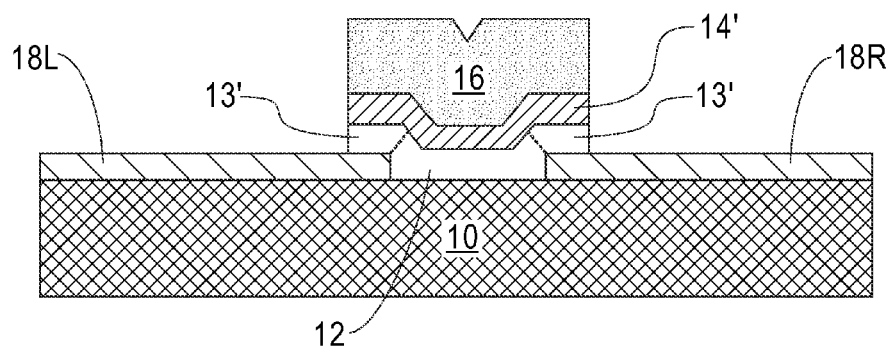
FIG. 7 is a pictorial representation (through a cross sectional view) illustrating the structure of FIG. 6 after removing exposed portions of the doped non-crystalline semiconductor material layer and corresponding underlying portions of the doped hydrogenated semiconductor material layer not protected by the at least one mask, and optional replacing the at least one mask with an electrode material portion.

Referring to FIG. 7, there is illustrated the structure of FIG. 6 after removing exposed portions of the doped non-crystalline semiconductor material layer 14 and corresponding underlying portions of the doped hydrogenated semiconductor material layer not protected by the at least one mask 20, and optional replacing the at least one mask 20 with an electrode material portion 16. Within the drawing, reference 13' denotes remaining portions of the doped hydrogenated non-crystalline semiconductor material layer portions 13, and 14' denotes a remaining doped non-crystalline semiconductor material of the doped non-crystalline semiconductor material layer 14.

When the at least one mask 20 is a conductive material, the step of replacing each mask 20 with an electrode material portion 16 can be omitted since the conductive mask can serve as the electrode material portion 16. As shown, the etch removes portions of the portions of the doped non-crystalline semiconductor material layer and portions of the doped hydrogenated semiconductor material layer which are not protected by mask 20 stopping on an upper surface of the passivation metal layer portions 18L, 18R.

In one embodiment, a single etch may be used to remove exposed portions of both the doped non-crystalline semiconductor material layer and portions of doped hydrogenated semiconductor material layer which are not protected by mask 20. In another embodiment, two separate etching steps can be used to remove the doped non-crystalline semiconductor material layer(s) and portions of the interfacial intrinsic non-crystalline semiconductor material layer(s) which are not protected by mask 20.

The etch or etches that can be used in this embodiment of the present disclosure may include for example, a dry etch process such as, for example, reactive ion etching, plasma etching or ion beam etching. Alternatively, a chemical wet etch can be employed. In one embodiment, the exposed portions of the doped non-crystalline semiconductor material layer(s) and portions of the interfacial intrinsic non-crystalline semiconductor material layer(s) which are not protected by mask 20 can be removed by $SF_6$, $SF_6/O_2$ or $CCl_2F_2/O_2$ plasma.

If the at least one mask 20 is other than a conductive material, the at least one mask 20 can be removed by conventional techniques, such as planarization and/or grinding, and an electrode material layer portion 16 can be formed as described above. In embodiments in which mask 20 is a conductive material, the mask 20 serves as one of the electrodes of the bipolar junction transistor of this embodiment of the present disclosure.

In cases in which a contact is needed on the other side of the crystalline semiconductor material 10, the crystalline semiconductor material 10 can be flipped 180° and the exposed bare surface of the crystalline semiconductor material 10 can be processed to include a contact of the present disclosure or another contact not of the present disclosure and an electrode material portion can be formed on an exposed uppermost surface of contact. The contact can span the entire length of the bare surface of the crystalline semiconductor material and the above processing can be used in forming the contact. Alternatively, a blanket passivation material layer (as described herein above) can be formed on the bare surface of the crystalline semiconductor material 10, and then patterned to include at least one opening therein. Thereafter, a contact in accordance with the present disclosure or another contact not of the present disclosure can be formed.

In the method described above, the adjoining end segment of each remaining doped hydrogenated non-crystalline semiconductor material layer portion 13' which is located beneath the electrode material portion 16 is present in the heterojunction bipolar transistor of the present disclosure. In this embodiment of the present disclosure, no portion of electrode material portion 16 of the heterojunction bipolar transistor produced by the method directly contacts an exposed surface of passivation layer portion 18L, 18R. Instead, an adjoining end segment of each non-crystalline portion 13 is positioned between the electrode material portion 16 and an exposed surface of the passivation material layer portion 18L, 18R. Thus, a heterojunction bipolar transistor is provided in which the electrode material portion 16 has an outer edge that is vertically coincident with an outer edge of the adjoining end segment of each remaining non-crystalline portion 13' and wherein an inner edge of the adjoining end segment of the non-crystalline portion 13' is in direct contact with a sidewall surface of the crystalline portion 12.

Referring now to FIGS. 8A, 8B and 8C, there are shown schematic energy band gap diagrams showing the emitter and collector junctions for various bipolar transistors including a conventional homojunction bipolar transistor (not of the present disclosure; and shown in FIG. 8A) and exemplary heterojunction bipolar transistors of the present disclosure (shown in FIGS. 8B, and 8C). Specially, the schematic energy band diagram of a prior art homojunction bipolar transistor on a p⁻ Si substrate is illustrated in FIG. 8A. Only the emitter (left) and collector (right) junctions are shown. In FIG. 8(B), the emitter junction of the bipolar transistor is replaced by an n⁺ c-Si:H/n⁺ a-Si:H stack, forming a heterojunction bipolar transistor, according to one embodiment of the present disclosure. In FIG. 2C, the collector junction is also replaced by an n⁺ c-Si:H/n⁺ a-Si:H stack, forming a "double-heterojunction" bipolar junction transistor, according to another embodiment of the present disclosure.

FIGS. 9A-9F are pictorial representations (through cross sectional views) illustrating some additional exemplary heterojunction bipolar transistors of the present disclosure. Each exemplary heterojunction bipolar transistor includes a contact of the present disclosure, i.e., a semiconductor material stack including a doped hydrogenated crystalline semiconductor material layer portion 12 and a doped non-crystalline semiconductor material 14'. Also, the contacts of the present disclosure include remaining portions of the doped hydrogenated non-crystalline semiconductor material layer portions 13' located on each sidewall of the doped hydrogenated crystalline semiconductor material layer portion 12. The remaining doped hydrogenated non-crystalline semiconductor material layer portions 13', are positioned between a bottommost surface of the doped non-crystalline semiconductor material 14' and a topmost surface of one of the passivation material layer portions 18'. The doped hydrogenated crystalline semiconductor material layer portion 12 separates the crystalline semiconductor material 10 from the doped non-crystalline semiconductor material 14'.

In FIGS. 9A, 9B, 9C, 9D and 9E, the collector contact and the emitter contact comprise a doped non-crystalline semiconductor material 14' of a conductivity type which differs from that of the crystalline semiconductor material 10 in which direct contact of the collector contact and emitter contact are made. The base contact within FIGS. 9A, 9B, 9C, 9D and 9E comprises a doped non-crystalline semiconductor material 14' or 50 of a conductivity type which is the same as that of the crystalline semiconductor material in which direct contact of the contact of the base contact is made. In this case, the concentration of the dopant within the doped non-crystalline semiconductor material 14' is greater than that of the semiconductor region of the crystalline semiconductor material in which direct contact is made with the base contact. In FIGS. 9A, 9B, 9C, 9D, 9E and 9F the conductivity type of the doped hydrogenated crystalline and non-crystalline semiconductor material layer portions 12, 13' is the same as that of the overlying doped non-crystalline semiconductor material 14'.

Specifically, FIGS. 9A, 9B, 9C, and 9D illustrate exemplary heterojunction bipolar transistors wherein the collector, C, and the emitter, E electrodes are located on one side of a crystalline semiconductor material 10 of a first conductivity type, and the base, B, electrode is located on another side of the crystalline semiconductor material 10 which is opposite the side including the emitter, E, and collector, C, electrodes. The collector, C, electrode and the emitter, E electrode, each include an electrode material portion 16C, and 16E, respectively, and a contact which includes a semiconductor material stack of the doped hydrogenated crystalline semiconductor material layer portion 12 and the doped non-crystalline semiconductor material 14' of a second conductivity which differs from the first conductivity type of the crystalline semiconductor material 10.

In FIG. 9A, the base, B, electrode includes an electrode material portion 16B, and a contact which includes a doped crystalline semiconductor material 50 of a first conductivity type (having a doping concentration greater than the crystalline semiconductor material) that expands the entire length of the backside surface of the crystalline semiconductor material; the contact of the base electrode is a prior art contact.

Figure 9B:
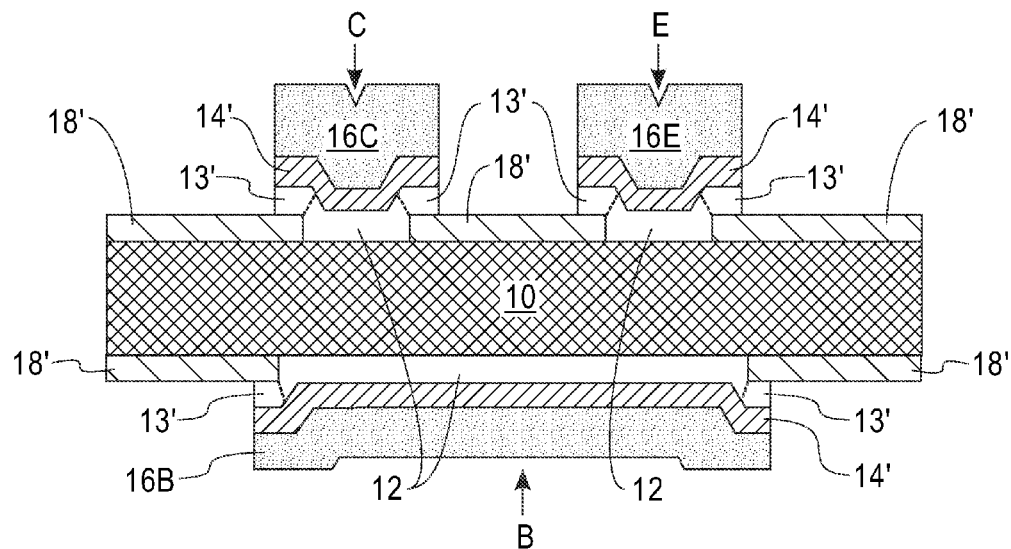

In FIG. 9B the contact for the base, B, electrode includes a semiconductor material stack of the doped hydrogenated crystalline semiconductor material layer portion 12 and the doped non-crystalline semiconductor material 14' of a first conductivity type which is the same as that of the semiconductor region of the crystalline semiconductor material 10 in which the direct contact of the contact of the base electrode is made. In this case, the concentration of the first conductivity type dopant within the doped non-crystalline semiconductor material 14' of the base contact is greater than that of the semiconductor region of the crystalline semiconductor material 10 in which direct contact is made with the base contact.

Figure 9C:
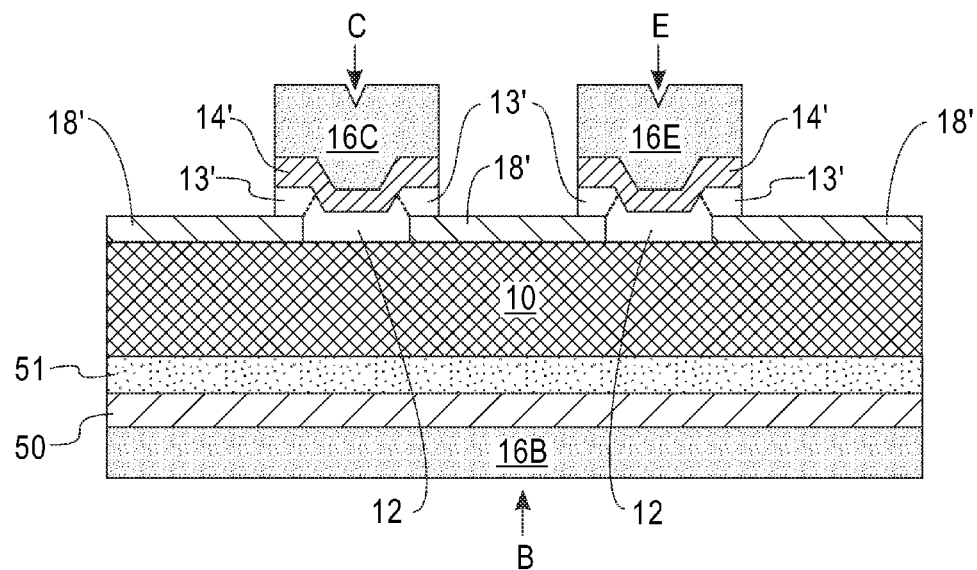
Figure 9D:
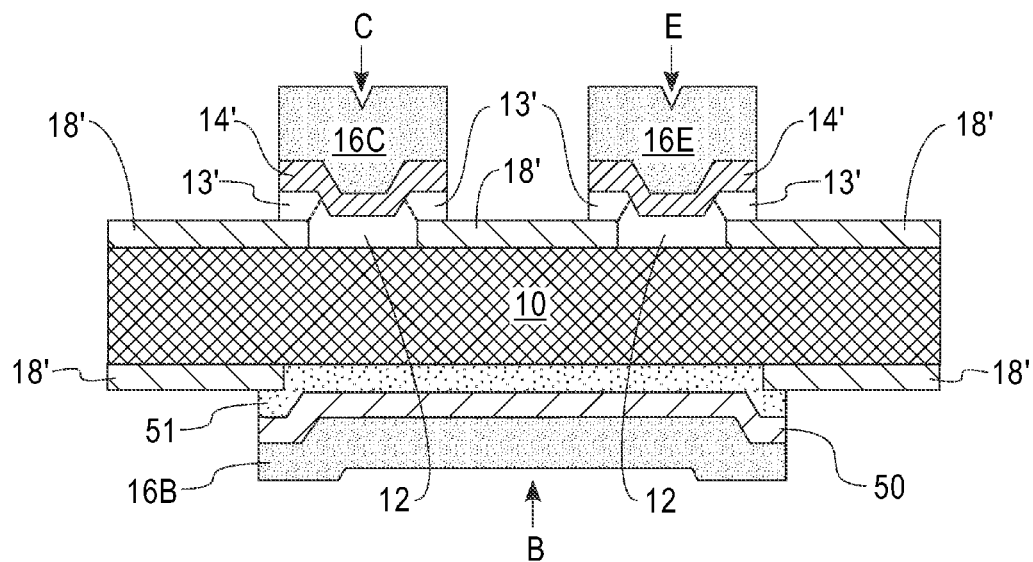

In FIGS. 9C-9D, the base, B, electrode includes an electrode material portion 16B, and a contact which includes an intrinsic hydrogenated non-crystalline semiconductor material layer 51 and a doped crystalline semiconductor material 50 of a first conductivity type (having a doping concentration greater than the crystalline semiconductor material); the contact of the base electrode is a prior art contact.

Figure 9E:
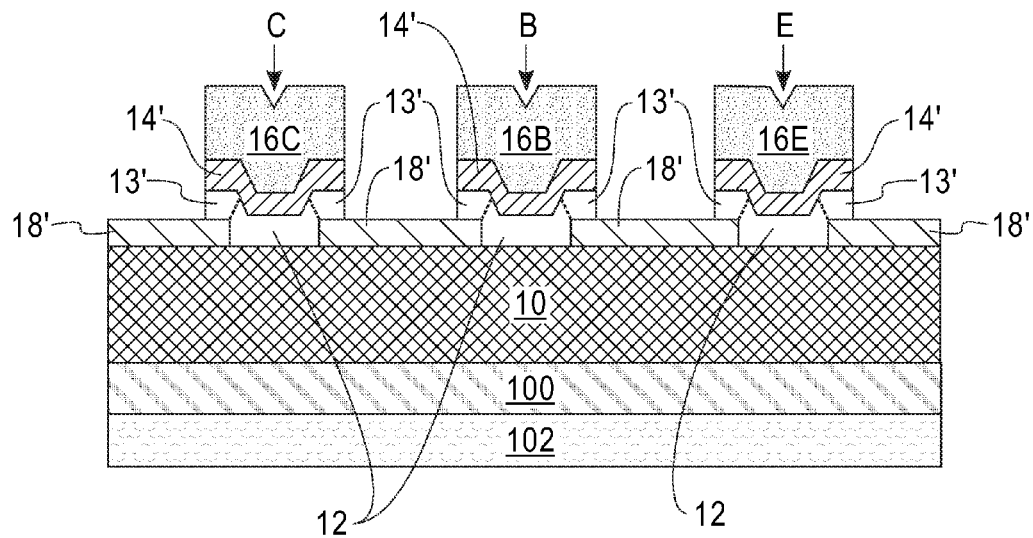
Figure 9F:
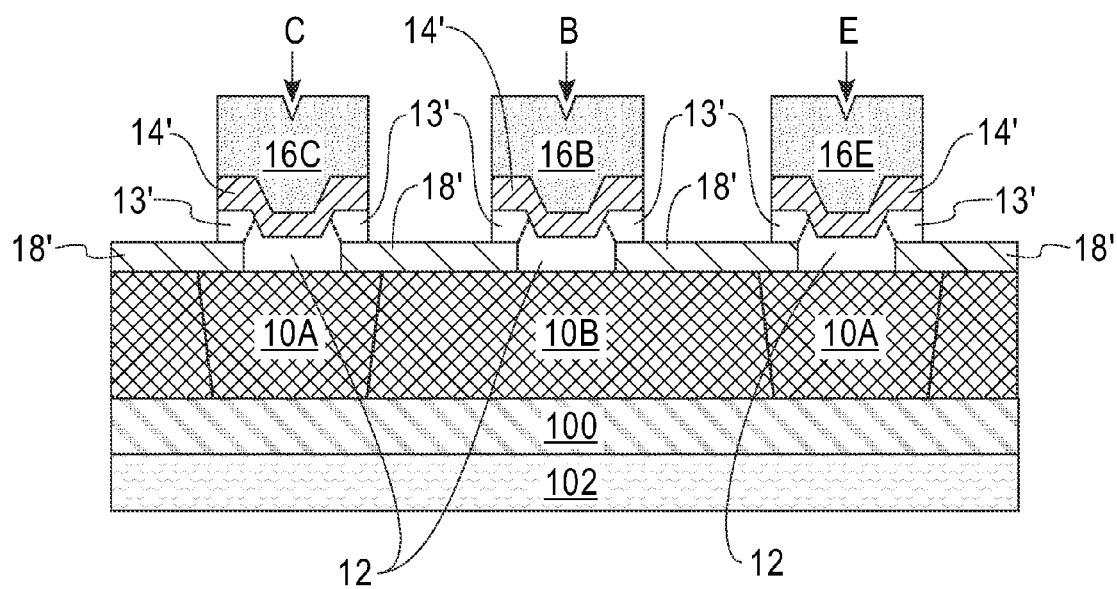

FIGS. 9E and 9F illustrate exemplary heterojunction bipolar transistors in which the collector, C, the emitter, E, and the base, B, electrodes are located on a same side of a crystalline semiconductor material 10. Each contact shown in FIGS. 9E and 9F are of the present disclosure. In one embodiment and as shown in FIG. 9E, the other side of the crystalline semiconductor material 10 has a surface that is in contact with a first surface of a buried insulating layer 100, and a handle substrate 102 is in contact with a second surface of the buried insulating layer 100. In such an embodiment, the entirety of the crystalline semiconductor material 10 is of a first conductivity type. In the structure shown in FIG. 9E, the doped non-crystalline semiconductor material 14' of the collector contact and the emitter contact, are each of a second conductivity which is opposite from the first conductivity of the crystalline semiconductor material 10. The doped non-crystalline semiconductor material 14' of the base contact is of the first conductivity, but the concentration of the first conductivity type dopant within the doped non-crystalline material 14' of the base contact is greater than that of the first conductivity type dopant in the crystalline semiconductor material 10.

In another embodiment, and as shown in FIG. 9F, the other side of the crystalline semiconductor material is in direct contact with a first surface of a buried insulating layer 100, and a second surface of the buried insulating layer, opposite to the first surface, is direct contact with surface of a handle substrate 102. In this embodiment, the crystalline semiconductor material 10 includes two crystalline semiconductor regions 10A of a first conductivity which are separated from each other by an adjoining crystalline semiconductor region 10B of a second conductivity that is opposite from the first conductivity type. In the structure shown in FIG. 9F, the semiconductor regions of the first conductivity type could be formed into a crystalline semiconductor material of a second conductivity type using the openings in the passivation material layer portions 18' by conventional techniques such as implantation and/or diffusion to define the base width, prior to the deposition of the contacts for the collector, base and the emitter electrodes. In the structure shown in FIG. 9F, the diffusion length of minority carriers (electrons in the p⁺ region and holes in the n⁺ regions) is typically larger (and preferably much larger) than the dimensions of the p⁺ or n⁺ doped regions formed by implantation and/or diffusion (Note the third dimension perpendicular to the plan of the drawing is not relevant). In the structure shown in FIG. 9F, the doped non-crystalline semiconductor material 14' of the collector contact and the emitter contact are each of a first conductivity type which is the same as the first conductivity type of the semiconductor regions 10A. In this structure, the concentration of the first conductivity type dopant within the doped non-crystalline material 14' of the collector contact and the emitter contact are preferably (but not necessarily) greater than that of the first conductivity type dopant in the crystalline semiconductor region 10A. The doped non-crystalline semiconductor material 14' of the base contact is of the second conductivity type, but the concentration of the second conductivity type dopant within the doped non-crystalline material 14' of the base contact is greater than that of the second conductivity type dopant in the crystalline semiconductor region 10B.

In either embodiment shown in FIGS. 9E and 9F, the collector, C, the emitter, E, and base, B, electrodes each include a patterned electrode material portion 16C, 16E, and 16B, respectively. The various collector, C, the emitter, E, and base, B, electrodes and their respective contacts are disjoined from each other and are separated by passivation material layer portions 18'.

In any of the embodiments described above, some, but not all of the contacts of the present disclosure can be replaced, with conventional contacts that are well known to those skilled in the art.

In some embodiments, the doped hydrogenated crystalline semiconductor material layer portion 12, and the doped non-crystalline semiconductor material 14' or both have a band gap larger than that of the crystalline semiconductor material 10. In such embodiments, if the disclosed stack is used for the emitter junction, the injection of carriers from base into the emitter is suppressed due the larger band gap of the doped layers, and therefore the gain of the heterojunction bipolar transistor is enhanced. In some embodiments, the doped hydrogenated crystalline semiconductor material layer portion 12, and the doped non-crystalline semiconductor material 14' are comprised of a bilayer, or a multilayered structure. Also the composition of the doped hydrogenated crystalline semiconductor material layer portion 12, and the doped non-crystalline semiconductor material 14' may be constant or vary across the layers. Examples of the doped non-crystalline semiconductor materials 14' include, but not limited to, a-Si: H, a-Ge:H, a-SiGe:H, a-SiC:H, a-SiO:H, a-SiN:H, nc-Si:H, nc-Ge:H, nc-SiGe:H, nc-SiC:H, nc-SiO:H, nc-SiN:H, μc-Si:H, μc-Ge:H, μc-SiGe:H, μc-SiC:H, μc-SiO:H, μc-SiN:H or combinations thereof; wherein a is amorphous, nc is nanocrystalline, μc is microcrystalline and H is hydrogenated. The band gap of a-Si:H is typically in the range of 1.7-1.8 eV; however, as known in the art, larger or smaller bandgaps are possible by varying the deposition conditions. The band gap of a-Ge:H is typically in the range of 0.9-1.2 eV; however, similar to a-Si:H, larger and smaller band gaps are also possible. An alloy of two semiconductor materials has a band gap depending linearly on the atomic fractions of the two semiconductors, e.g., an alloy of a-Si$_x$Ge$_{1-x}$ has a band gap of $xE_{g1}+(1-x)E_{g2}$, where $E_{g1}$ is the band gap of a-Si:H, $E_{g2}$ is the band gap of a-Ge:H, x the atomic fraction of Si (number of Si atoms in the lattice divided by the total number of Si and Ge atoms), and $_{1-x}$ the atomic fraction of Ge. (note that 0≤x≤1). Similarly, the band gap of an a-Si$_x$C$_{1-x}$:H alloy is increased typically from 1.7-1.8 eV to 3.6-3.7 eV as the atomic fraction of C is increased from 0 to 1. Addition of N, O or both to a-Si:H, a-Ge:H or a-SiGe:H increases the band gap, but the increase in band gap is not typically a linear function of the atomic percentage. Hydrogenated amorphous silicon-nitride (a-Si$_x$N$_{1-x}$:H) typically has a band gap of 5-5.5 eV for the stoichiometric composition x=0.42, and the band gap can be varied by changing the atomic percentage of N. Hydrogenated amorphous silicon oxide (a-SiO:H) has band gaps comparable with a-SiN:H. The band gap of semiconductor alloys or oxides/nitrides may be varied by changing the crystalline portion of the materials. The band gap of nanocrystalline or microcrystalline materials is generally lower that that of amorphous materials having the same composition. The band gap of hydrogenated nano/microcrystalline Si varies between ~1.1 eV to ~1.8 eV as the material structure varies from fully single/poly-crystalline to fully amorphous. Similarly, the band gap of hydrogenated nano/microcrystalline Ge varies between ~0.6 eV to ~1.2 eV as the material structure varies from fully single/poly-crystalline to fully amorphous. Similarly, the band gaps of hydrogenated nano/micro-crystalline SiC, SiO, SiGeO, GeO and SiN compounds are lower than that of a-SiC:H, a-SiO:H, a-SiGeO:H, a-GeO:H and a-SiN:H, respectively. (This also applies to combinations thereof). In the PECVD process, the crystalline portion 12 of the materials may be increased by increasing the hydrogen dilution of the source gases, increasing the plasma frequency (typically up to 120 MHz) or both. For example, hydrogenated nano-crystalline silicon oxide (nc-SiO:H) may be grown by PECVD with a band gap in the range of 0.8-2.5 eV, depending on the growth conditions and oxygen content of the film.

In some embodiments, the doped hydrogenated crystalline semiconductor material layer portion 12, and the doped non-crystalline semiconductor material 14' have a band gap lower than that of the crystalline semiconductor material 10. In such embodiments, the contact resistance at the junction may be improved due to the lower band gap of the doped layer (or due to the lower band gap of both the doped layer and the intrinsic interlayer). This is particularly useful in the case of wide-gap semiconductor substrates, particularly with band gap larger than 2.0 eV. Examples of such wide-gap semiconductors include but are not limited to gallium nitride (GaN), indium gallium nitride (InGaN), gallium phosphide (GaP), indium phosphide (InP), gallium phosphide nitride (GaPN), gallium antimony nitride (GaSbN), gallium arsenide phosphorous nitride (GaAsPN). In these embodiments, superlattice structures may be used for the doped layers (as discussed earlier) to improve carrier injection at the emitter junction and/or lowering the contact resistance at the junction (emitter or other junctions).

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:
1. A heterojunction bipolar transistor comprising:
a crystalline semiconductor material; and
at least one contact in direct physical contact with a surface portion of the crystalline semiconductor material, wherein said at least one contact comprises a doped hydrogenated crystalline semiconductor material layer portion in direct contact with the surface portion of the crystalline semiconductor material, and a doped non-crystalline semiconductor material located on a surface of the doped hydrogenated crystalline semiconductor material layer portion.

2. The heterojunction bipolar transistor of claim 1, wherein said doped non-crystalline semiconductor material is hydrogenated.

3. The heterojunction bipolar transistor of claim 1, wherein said doped non-crystalline semiconductor material is non-hydrogenated.

4. The heterojunction bipolar transistor of claim 1, further comprising another doped non-crystalline semiconductor material located on a surface of said doped non-crystalline semiconductor material, wherein said another doped non-crystalline semiconductor material has a lower band gap than the doped non-crystalline semiconductor material.

5. The heterojunction bipolar transistor of claim 1, wherein said doped non-crystalline semiconductor material comprises a multilayered stack of alternating wide band gap semiconductor materials and narrow band gap semiconductor materials.

6. The heterojunction bipolar transistor of claim 1, further comprising an electrode material portion atop the doped non-crystalline semiconductor material.

7. The heterojunction bipolar transistor of claim 1, further comprising passivation material layer portions located on other surface portions of the crystalline semiconductor material in which said at least one contact is not in direct physical contact with the surface portion of the crystalline semiconductor material.

8. The heterojunction bipolar transistor of claim 7, further comprising a doped hydrogenated non-crystalline semiconductor material layer portion located adjoining each edge of said doped hydrogenated crystalline semiconductor material layer portion, wherein a bottommost surface of each of said doped hydrogenated non-crystalline semiconductor material layer portions is present on an upper surface of one of said passivation material layer portions.

9. The heterojunction bipolar transistor of claim 8, wherein each doped hydrogenated non-crystalline semiconductor material layer portion has an outer edge that is vertical coincident to an outer edge of said doped non-crystalline semiconductor material.

10. The heterojunction bipolar transistor of claim 1, wherein said at least one contact is selected from a collector contact, an emitter contact, a base contact, and any combination thereof.

11. The heterojunction bipolar transistor of claim 10, wherein said collector contact and said emitter contact are located on a first side of the crystalline semiconductor material and said base contact is located on a second side of the crystalline semiconductor material which is opposite said first side.

12. The heterojunction bipolar transistor of claim 11, wherein said doped non-crystalline semiconductor material of said collector contact and said emitter contact is of a conductivity type that is opposite to a conductivity type of said crystalline semiconductor material.

13. The heterojunction bipolar transistor of claim 11, wherein said doped non-crystalline semiconductor material and doped crystalline semiconductor material of said base contact are of a conductivity type that is the same as a conductivity type of said crystalline semiconductor material, and wherein the dopant concentration of at least one of the said doped non-crystalline semiconductor material and the said doped crystalline semiconductor material of said base contact is greater than the dopant concentration of the crystalline semiconductor material.

14. The heterojunction bipolar transistor of claim 10, wherein said collector contact, said emitter contact, and said base contact are each located on a first side of the crystalline semiconductor material.

15. The heterojunction bipolar transistor of claim 14, wherein said doped non-crystalline semiconductor material and said doped crystalline semiconductor material of said collector contact and said emitter contact are of a conductivity type that is opposite to a conductivity type of said crystalline semiconductor material.

16. The heterojunction bipolar transistor of claim 15, wherein said doped non-crystalline semiconductor material and said doped crystalline semiconductor material of said base contact are of a conductivity type that is the same as a conductivity type of said crystalline semiconductor material, and wherein the dopant concentration of at least one of the said doped non-crystalline semiconductor material and the said doped crystalline semiconductor material of said base contact is greater than the dopant concentration of the crystalline semiconductor material.

17. The heterojunction bipolar transistor of claim 1, wherein said doped hydrogenated crystalline semiconductor material layer portion has an epitaxial relationship with the surface portion of said crystalline semiconductor material in which direct contact occurs, and wherein said doped hydrogenated crystalline semiconductor material layer portion.

18. The heterojunction bipolar transistor of claim 17, wherein minority carriers within the doped hydrogenated crystalline semiconductor material layer portion have a diffusion length that is larger than a thickness of said doped hydrogenated crystalline semiconductor material layer portion.

19. A heterojunction bipolar transistor comprising:
a crystalline semiconductor material having two crystalline semiconductor regions of a first conductivity type which are spaced apart by an adjoining crystalline semiconductor region of a second conductivity type which is opposite from the first conductivity type;
a collector contact in direct physical contact with a surface portion of one of crystalline semiconductor regions of the first conductivity type, wherein the collector contact comprises a first doped hydrogenated crystalline semiconductor material layer portion in direct contact with the surface portion of one of the crystalline semiconductor regions of the first conductivity type and a first doped non-crystalline semiconductor material of the first conductivity type located on a surface of the first doped hydrogenated crystalline semiconductor material layer portion;
an emitter contact in direct physical contact with a surface portion of another of the crystalline semiconductor regions of the first conductivity type, wherein the emitter contact comprises a second doped hydrogenated crystalline semiconductor material layer portion in direct contact with the surface portion of the another of the crystalline semiconductor region of the first conductivity type and a second doped non-crystalline semiconductor material of the first conductivity type located on a surface of the second doped hydrogenated crystalline semiconductor material layer portion; and
a base contact in direct physical contact with a surface portion of the adjoining crystalline semiconductor region of the second conductivity type, wherein the base contact comprises a third doped hydrogenated crystalline semiconductor material layer portion in direct contact with the surface portion of the adjoining crystalline semiconductor region of the second conductivity type and a third doped non-crystalline semiconductor material of the second conductivity type located on a surface of the third doped hydrogenated crystalline semiconductor material layer portion.

20. The heterojunction bipolar transistor of claim 19, further comprising passivation material layer portions located on other surface portions of the crystalline semiconductor material in which said at least collector, emitter and base contacts are not in direct physical contact with the surface portions of the crystalline semiconductor material.

21. The heterojunction bipolar transistor of claim 19, further comprising a doped hydrogenated non-crystalline semiconductor material layer portion located adjoining each edge of said first, second and third doped hydrogenated crystalline semiconductor material layer portions, wherein a bottommost surface of each of said doped hydrogenated non-crystalline semiconductor material layer portions is present on an upper surface of one of said passivation material layer portions.

* * * * *